United States Patent
Murayama

(10) Patent No.: US 8,679,880 B2
(45) Date of Patent: Mar. 25, 2014

(54) THIN FILM FORMING METHOD AND QUANTUM DOT DEVICE

(75) Inventor: Koji Murayama, Nagaokakyo (JP)

(73) Assignee: Murata Manufaaturing Co., Ltd., Nagaokakyo-shi, Kyoto-fu (JP)

( * ) Notice: Subject to any disclaimer, the term of this patent is extended or adjusted under 35 U.S.C. 154(b) by 0 days.

(21) Appl. No.: 13/524,283

(22) Filed: Jun. 15, 2012

(65) Prior Publication Data

US 2012/0248410 A1   Oct. 4, 2012

Related U.S. Application Data

(63) Continuation of application No. PCT/JP2010/072233, filed on Dec. 10, 2010.

(30) Foreign Application Priority Data

Dec. 18, 2009   (JP) .................................. 2009-288159

(51) Int. Cl.
   *H01L 21/00* (2006.01)
(52) U.S. Cl.
   USPC .................. 438/38; 438/45; 257/13; 257/45; 257/103; 257/E33.008; 257/E33.001
(58) Field of Classification Search
   USPC .............. 257/13, 21, E31.001, E33.008, 257/E33.001, E31.033, 12, 94, 103; 438/47, 94, 38, 45; 977/895, 896, 773, 977/774
   See application file for complete search history.

(56) References Cited

U.S. PATENT DOCUMENTS

| 7,615,800 B2* | 11/2009 | Kahen ............................ 257/103 |
| 8,120,010 B2* | 2/2012 | Cho et al. ......................... 257/13 |
| 2003/0042850 A1 | 3/2003 | Bertram et al. |
| 2008/0206565 A1 | 8/2008 | Takahashi et al. |
| 2009/0087546 A1 | 4/2009 | Ilzumi et al. |
| 2010/0006153 A1 | 1/2010 | Rauscher et al. |
| 2010/0224856 A1 | 9/2010 | Iizumi et al. |

FOREIGN PATENT DOCUMENTS

| CN | 101283454 A | 10/2008 |
| JP | 2005-502176 A | 1/2005 |
| JP | 2008-214363 A | 9/2008 |
| JP | 2008-215363 A | 9/2008 |
| JP | 2009-087782 A1 | 4/2009 |
| WO | WO-2008-104301 A2 | 9/2008 |
| WO | WO-2009-041596 A1 | 4/2009 |

OTHER PUBLICATIONS

PCT/JP2010/072233 Written Opinion dated Feb. 28, 2011.
Japanese Office Action issued for corresponding application JP 2011-546088, dispatch date May 7, 2013 (with English translation).

* cited by examiner

*Primary Examiner* — Jarrett Stark
*Assistant Examiner* — Shahed Ahmed
(74) *Attorney, Agent, or Firm* — Dickstein Shapiro LLP

(57) ABSTRACT

An electron transporting surfactant is added to a raw material solution such that the electron transporting surfactant is coordinated on the surfaces of quantum dots, and after the dispersion solvent is evaporated by vacuum drying, the immersion in a solvent containing a hole transporting surfactant prepares a quantum dot dispersed solution with a portion of the electron transporting surfactant replaced with the hole transporting surfactant. The quantum dot dispersed solution is applied onto a substrate to prepare a hole transport layer and a quantum dot layer at the same time, and thereby to achieve a thin film which has a two-layer structure.

12 Claims, 11 Drawing Sheets

THIN FILM FORMING METHOD AND QUANTUM DOT DEVICE

CROSS REFERENCE TO RELATED APPLICATIONS

The present application is a continuation of International Application No. PCT/JP2010/072233, filed Dec. 10, 2010, which claims priority to Japanese Patent Application No. 2009-288159, filed Dec. 18, 2009, the entire contents of each of these applications being incorporated herein by reference in their entirety.

FIELD OF THE INVENTION

The present invention relates to a thin film forming method and a quantum dot device, and more particularly, relates to a thin film forming method for forming a quantum dot layer in which carrier transporting surfactants are coordinated on the surface of a quantum dot, and a quantum dot device such as a photoelectric conversion device including the quantum dot layer.

BACKGROUND OF THE INVENTION

Quantum dots which are ultrafine particles of 10 nm or less in particle size have an excellent carrier (electrons, holes) confinement capability, and thus, can easily generate excitons through recombination of electron-hole. For this reason, luminescence from free excitons can be expected, and it is possible to achieve luminescence with a high luminance efficiency and a sharp luminescence spectrum. In addition, quantum dots can be controlled in a wide range of wavelengths through the use of quantum size effect, and thus have been attracting attention for application to light emitting devices such as semiconductor lasers and light emitting diodes (LED).

Incidentally, colloidal quantum dots are chemically synthesized in a liquid phase, and typically have surfaces covered with organic molecules of a surfactant so as to prevent agglomeration of the quantum dots with each other. Therefore, the colloidal quantum dots have a high electric potential barrier because of the low conductivity of the surfactant due to the organic molecules, and for this reason, have the drawback of being low in photoelectric conversion efficiency through carriers (hole and electrons). In addition, when a conductive polymer or a metallic material is used as the surfactant, the carriers injected into electrodes by voltage application will pass through the surfactant from the positive electrode to the negative electrode or from the negative electrode to the positive electrode, and it is thus difficult to efficiently confine the carriers in the quantum dots.

FIG. 13 is a schematic diagram of a photoelectric conversion device on the assumption of the use of a conductive surfactant.

This photoelectric conversion device have a quantum dot layer 105 interposed between a hole transport layer 102 formed on the upper surface of a positive electrode 101 and an electron transport layer 104 formed on the lower surface of a negative electrode 103. Further, this quantum dot layer 105 has a surface coated with a conductive surfactant 109, so as to prevent agglomeration of quantum dots 108 with each other, which are each composed of a core section 106 and a shell section 107. More specifically, the quantum dot layer 105 has a stacked structure with a large number of quantum dots 108 provided in lines, and the surfactant 109 is interposed between the quantum dots 108.

Then, when a voltage is applied between the positive electrode 101 and the negative electrode 103, holes are injected into the positive electrode 101, whereas electrons are injected into the negative electrode 103. Then, the holes and electrons as carriers passes through the conductive surfactant 109, and without being confined in the quantum dots 108, the holes are transported in a direction to the negative electrode 103, whereas the electrons are transported in a direction to the positive electrode 101, as indicated by an arrow a and an arrow b. More specifically, when the conductive surfactant 109 is used, the carriers will merely provide conduction, and it is not possible to confine the carriers in the quantum dots 108.

Furthermore, techniques have been also researched and developed, which are adapted to use a surfactant with both hole transporting and electron transporting ligands.

For example, Patent Document 1 proposes a nanoparticle luminescent material including a surfactant composed of at least two types of ligands localized on the surfaces of quantum dots, wherein at least one of the ligands is a hole transporting ligand, whereas at least one thereof is an electron transporting ligand.

In Patent Document 1, the coordination of both the electron transporting ligand and hole transporting ligand on the surfaces of the nanoparticles allows the suppression of charge transport between the ligands, thereby improving the efficiency of charge injection into the nanoparticles.

In addition, in Patent Document 1, a dispersed solution of quantum dots as nanoparticles is prepared by a method as shown in FIG. 14.

First, in a raw material solution preparation step 111, a chloroform dispersed solution of CdSe nanoparticles is prepared. Specifically, a toluene dispersed solution of CdSe nanoparticles which have surfaces coated with TOPO (trioctylphosphineoxide) is stirred with the addition of methanol, and then subjected to centrifugation to produce CdSe nanoparticles, and after removing the supernatant solution, the precipitated CdSe nanoparticles are subjected to drying, and then the addition of chloroform to prepare a chloroform dispersed solution of the CdSe nanoparticles, that is, a raw material solution.

Then, in a surfactant addition step 112, a surfactant containing a hole transporting ligand (for example, an α-NPD derivative) and a surfactant containing an electron transporting ligand (for example, BPhen) are added to the raw material solution.

Then, in a ligand replacement step 113, stirring is carried out in a nitrogen atmosphere for a predetermined period of time under the conditions of room temperature and light shielding, and then the resultant is allowed to stand still to conduct a ligand replacement operation, followed by coating the surfaces of the CdSe nanoparticles with the hole transporting surfactant and the electron transporting surfactant.

Subsequently, in a suspended ligand removal step 114, unwanted ligands are removed which are replaced and suspended in the solution. This suspended ligand removal step 114 has two treatment steps of a poor solvent addition treatment 114a and a supernatant solution removal treatment 114b, in which an appropriate amount of poor solvent such as methanol is added to produce a precipitate in the poor solvent addition treatment 114a, and in the subsequent supernatant solution removal treatment 114b, the suspended ligands are removed along with the supernatant solution. Then, a series of treatment steps composed of the poor solvent addition treatment 114a and the supernatant solution removal treatment 114b is repeated more than once, thereby purifying a powder of CdSe fine particles.

Then, in a redispersion step 115, a dispersion solvent such as chloroform is added to the powder of CdSe fine particles for the redispersion of the powder, thereby providing a transparent quantum dot dispersed solution in which the nanoparticle luminescent material is dispersed.

More specifically, when the ligand replacement is carried out in the solution in which the hole transporting ligand and the electron transporting ligand coexist, replaced unwanted ligands are suspended in the solution. Therefore, when this solution is used directly to prepare a thin film, there is a possibility that a large number of suspended ligands will penetrate the film to impair the function.

Thus, in Patent Document 1, a series of treatment step of: adding the poor solvent to produce a precipitate in the poor solvent addition treatment 114a of the suspended ligand removal step 114; and removing the supernatant solution to remove unwanted suspended ligands in the subsequent supernatant solution removal treatment 114b, is repeated more than once to completely remove the suspended ligands, and the powder is then dispersed in the dispersion solvent to obtain the quantum dot dispersed solution.

Patent Document 1: Japanese Patent Application Laid-Open No. 2008-214363 (claim 1, paragraphs [0078] and [0079])

SUMMARY OF THE INVENTION

However, in the case of Patent Document 1, because the respective treatments of the poor solvent addition treatment 114a and the supernatant solution removal treatment 114b are repeated more than once as described above, there is a possibility that the surfactants coordinated on the surfaces of the quantum dots will be peeled to decrease the surface coverage during the treatment step, and as a result, the insufficient inactivation of surface defects will cause nonradiative recombination of holes and electrons via surface defects of the quantum dots. Then, there is a possibility that this nonradiative recombination of holes and electrons will decrease the quantum yield, thereby leading to a decrease in carrier transport efficiency.

The present invention has been achieved in view of these circumstances, and an object of the present invention is to provide a thin film forming method which can prepare, with high efficiency, a thin film including a quantum dot layer in which two types of different surfactants in terms of function are coordinated on the surface of a quantum dot, and a quantum dot device such as a photoelectric conversion device, which provides a favorable carrier transport efficiency through the use of the thin film forming method.

The present inventors have carried out earnest researches in order to achieve the object mentioned above, and found that a quantum dot with a first surfactant coordinated on the surface thereof is, in a solution, brought into contact with a second surfactant prepared in large amounts as compared with the first surfactant, thereby efficiently making it possible to replace a portion of the first surfactant with the second surfactant, thereby making it possible to achieve a quantum dot dispersed solution in which the two types of surfactants which differ in function are concurrently coordinated on the surface of the quantum dot.

In addition, the present inventors have further proceeded with earnest researches, and found that a second surfactant layer and a quantum dot layer with both the first and second surfactants coordinated on the surface thereof can be prepared at the same time on a substrate by applying, onto the substrate, the quantum dot dispersed solution obtained in the way described above.

The present invention has been made based on these findings, and a thin film forming method according to the present invention has a feature in that a quantum dot with a first surfactant is prepared, which has the first surfactant coordinated on a surface of the quantum dot; a second surfactant prepared in large amounts as compared with the first surfactant is brought into contact with the quantum dot with the first surfactant in the solution to prepare a quantum dot dispersed solution in which a portion of the first surfactant is replaced with the second surfactant; and the quantum dot dispersed solution is then applied onto a substrate to prepare a second surfactant layer containing the second surfactant as its main constituent and a quantum dot layer with the first and second surfactants coordinated on a surface thereof at the same time, and thus to form a thin film having a two-layer structure.

In addition, in the thin film forming method according to the present invention, after drying a first dispersed solution in which the quantum dot with the first surfactant is dispersed, the quantum dot with the first surfactant is preferably immersed in a second dispersed solution containing the second surfactant, to prepare the quantum dot dispersed solution.

Furthermore, in the thin film forming method according to the present invention, the second surfactant is preferably immersed in a first dispersed solution in which the quantum dot with the first surfactant is dispersed, to prepare the quantum dot dispersed solution.

In addition, in the thin film forming method according to the present invention, the quantum dot layer is preferably formed on a surface of the second surfactant layer.

Further, the first surfactant is one of an electron transporting surfactant and a hole transporting surfactant, whereas the other is the second surfactant, thereby allowing the two types of surfactants which differ in carrier transport property to be replaced with each other in the solution with high efficiency. Then, this quantum dot dispersed solution can be used to prepare a hole transport layer or an electron transport layer, as well as a desired quantum dot layer at the same time, and thus achieve a thin film forming method which is suitable for the preparation of a quantum dot device.

More specifically, in the thin film forming method according to the present invention, preferably, the first surfactant is an electron transporting surfactant, and the second surfactant is a hole transporting surfactant.

Alternatively, in the thin film forming method according to the present invention, preferably, the first surfactant is a hole transporting surfactant, and the second surfactant is an electron transporting surfactant.

In addition, in the thin film forming method according to the present invention, a dispersion solvent of the quantum dot dispersed solution is preferably chloroform.

Furthermore, in the thin film forming method according to the present invention, the quantum dot preferably has a core-shell structure.

In addition, a quantum dot device according to the present invention is a quantum dot device comprising a quantum dot layer interposed between a first surfactant layer and a second surfactant layer, wherein the second surfactant layer and the quantum dot layer are produced by using any of the thin film forming methods described above.

In addition, the quantum dot device according to the present invention is preferably a photoelectric conversion device.

In the thin film forming method according to the present invention, a quantum dot with a first surfactant is prepared, which has the first surfactant coordinated on a surface of the quantum dot, a second surfactant prepared in large amounts as compared with the first surfactant is brought into contact with the quantum dot with the first surfactant in the solution, thereby preparing a quantum dot dispersed solution in which a portion of the first surfactant is replaced with the second surfactant. Thus, a series of complicated step for removing suspended ligands is eliminated to make it possible to easily carry out a ligand replacement treatment without peeling of the surfactants from the surface of the quantum dot. More specifically, a desired ligand replacement treatment can be carried out without providing a series of complicated step for removing suspended ligands, which can suppress a decrease in surface coverage, thus allowing a decrease in quantum yield to be suppressed as much as possible.

Then, the quantum dot dispersed solution is then applied onto a substrate, thereby preparing, at the same time, a second surfactant layer containing the second surfactant as its main constituent and a quantum dot layer with the first and second surfactants coordinated on a surface thereof. Thus, a thin film which has a two-layer structure composed of the second surfactant layer and the quantum dot layer can be prepared by one film-forming process, and the production step can be also simplified, thus allowing for reduction in cost.

Specifically, the quantum dot dispersed solution can be prepared by immersing the quantum dot with the first surfactant in the second dispersed solution containing the second surfactant after the first dispersed solution in which the quantum dot with the first surfactant is dispersed is subjected to vacuum drying.

Alternatively, the quantum dot dispersed solution can be also prepared by immersing the second surfactant in the first dispersed solution in which the quantum dot with the first surfactant is dispersed.

In addition, the adoption of an electron transporting surfactant for the first surfactant and a hole transporting surfactant for the second surfactant can prepare, at the same time, a hole transport layer and a quantum dot layer with carrier transporting surfactants, and thus simplify the film-forming process, thereby allowing reduction in cost.

Alternatively, the adoption of a hole transporting surfactant for the first surfactant and an electron transporting surfactant for the second surfactant can prepare, at the same time, an electron transport layer and a quantum dot layer with carrier transporting surfactants, and thus as in the case described above, simplify the film-forming process, thereby allowing reduction in cost.

In particular, this case is preferred for the preparation of a quantum dot device, because the electron transport layer is formed on the substrate side. More specifically, it is often the case where a chemically active material is used for the negative electrode connected to the electron transport layer, and for this reason, the negative electrode is desirably prevented as much as possible from being brought into contact with the atmosphere. Thus, the electron transport layer provided on the substrate side will confine the negative electrode in the device, thereby allowing the device sealing to be simplified, and allowing further reduction in cost.

In addition, the adoption of chloroform for a dispersion solvent of the quantum dot dispersed solution can easily achieve the separation into the second surfactant layer and the quantum dot layer, because the chloroform is highly volatile.

Moreover, the quantum dot device according to the present invention is a quantum dot device which has a quantum dot layer interposed between the first surfactant layer and the second surfactant layer, and the second surfactant layer and the quantum dot layer are produced by using any of the thin film forming methods described above. Thus, a reduction in surface coverage can be suppressed. Therefore, at the time of the injection of carriers into the quantum dot and also at the time of the extraction of carriers from the quantum dot, useless carrier deactivation can be avoided as much as possible, thereby improving the quantum yield in the transition process.

Moreover, the quantum dot layer formed on the second surfactant layer has the concurrently coordinated surfactants for transporting only electrons or only holes on the surface of the quantum dot, thus, the surfactants are delivered quite close to each other in the quantum dot layer, and the same carrier transport surfactants can form a network (bulkhetero-like network) to transport carriers. Accordingly, the carrier recombination in the surfactants can be prevented more effectively, thereby allowing the carrier transport efficiency to be improved dramatically.

Thus, the quantum dot device according to the present invention can, without recombination of holes and electrons near the surfaces of quantum dots as ultrafine particles or in the surfactants, efficiently transport carriers generated by light irradiation in the quantum dots, to the electrode side, and efficiently transport carriers injected by voltage application into the electrodes, into the quantum dots. Further, this efficient transport can improve the transport efficiency (injection efficiency) of carriers into the quantum dots and the transport efficiency (extraction efficiency) of carriers from the quantum dots.

In addition, the quantum dot device according to the present invention, in the case of a photoelectric conversion device, provides a favorable carrier transport efficiency in the quantum dot layer, and can thus achieve the conversion from optical signals to electrical signals or the conversion from electrical signals to optical signals with high efficiency, thereby allowing the achievement of various types of practical photoelectric conversion devices.

DETAILED DESCRIPTION OF THE INVENTION

Next, embodiments of the present invention will be described in detail.

Figure 1:
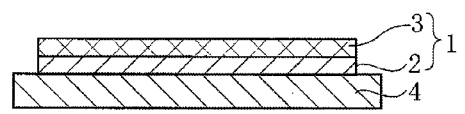
FIG. 1 is a cross-sectional view schematically illustrating an embodiment (first embodiment) of a thin film prepared by the use of a thin film forming method according to the present invention.

FIG. 1 is a cross-sectional view schematically illustrating an embodiment of a thin film prepared by the use of a thin film forming method according to the present invention.

This thin film 1 has a two-layer structure of a hole transport layer 2 containing a hole transporting surfactant (second surfactant) as its main constituent and a quantum dot layer 3, and is formed on a substrate 4.

Figure 2:
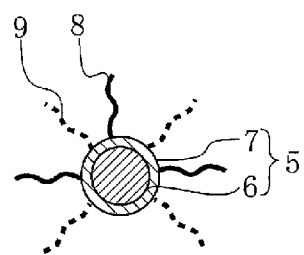
FIG. 2 is a cross-sectional view schematically illustrating carrier transporting surfactants coordinated on the surface of a quantum dot.

Each quantum dot 5 constituting the quantum dot layer 3 has, as shown in FIG. 2, a core-shell structure including a core section 6 and a shell section 7 for protecting the core section 6, and the surface of the shell section 7 has a concurrent coordination form of a hole transporting surfactant 8 and an electron transporting surfactant 9.

In this case, a core material for forming the core section 6 is not particularly limited as long as the material is a semiconductor material which has a photoelectric conversion effect, and ZnSe, ZnTe, InP, InSe, CdSe, CdS, PbSe, and the like can be used, and as a shell material constituting the shell section 7, for example, ZnS can be used.

Next, a method for preparing the thin film 1 will be described in detail.

While various materials can be used for ultrafine particles constituting the quantum dots 5 as described above, the case of using InP for the core section 6 and ZnS for the shell section 7 will be described as an example in the following embodiment.

Figure 3:
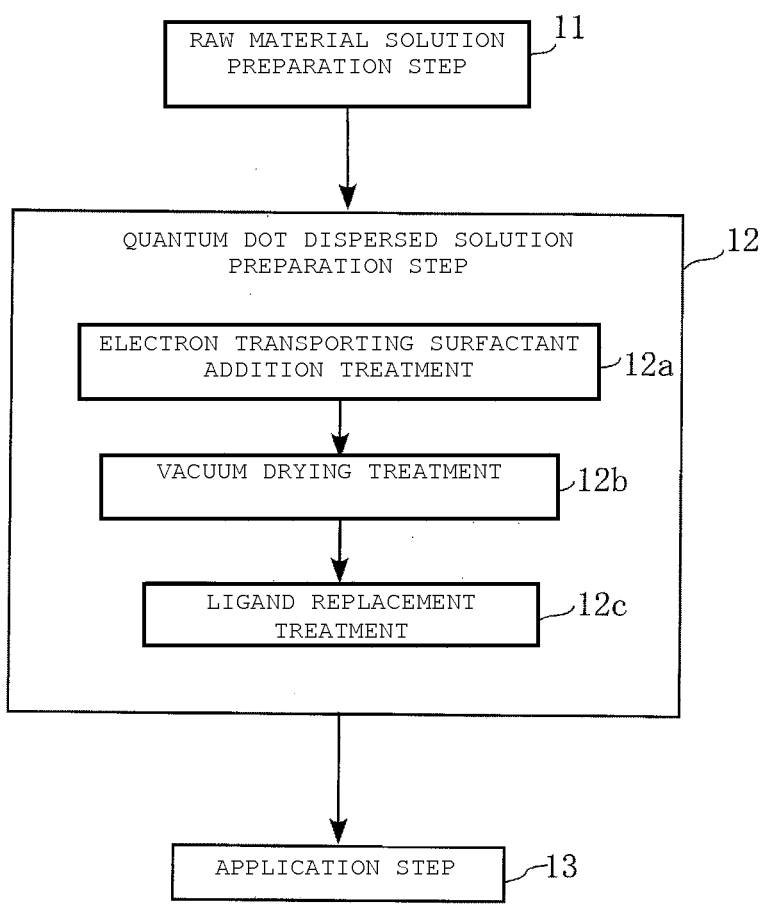
FIG. 3 is a production step diagram showing an embodiment (first embodiment) of a thin film forming method according to the present invention.

FIG. 3 is a production step diagram showing an embodiment of a preparation method (thin film forming method) for the thin film 1.

In a raw material solution preparation step 11, an InP/ZnS dispersed solution is prepared.

More specifically, for example, indium acetate, myristic acid, and octadecene are mixed in a container, and dissolved by stirring in a nitrogen atmosphere to prepare an indium precursor solution. Furthermore, tristrimethylsilylphosphine, octylamine, and octadecene are mixed in a nitrogen atmosphere to prepare a phosphorus precursor solution.

Then, the indium precursor solution is heated to a predetermined temperature (for example, 190° C.), and in this heated solution, the phosphorus precursor solution is injected. Then, the high temperature reacts the highly active precursors with each other, the indium is bonded to the phosphorus to form nucleus, and the nucleus then react with surrounding unreacted components to develop crystal growth, thereby creating InP quantum dots.

Next, prepared are a zinc oxide solution with zinc oxide dissolved in stearic acid and a sulfur solution with sulfur dissolved in stearic acid.

Then, the zinc oxide solution and the sulfur solution are alternately added dropwise into an InP quantum dot solution adjusted to a predetermined temperature (for example, 150° C.), and the resultant solution is subjected to heating and cooling, and to washing to remove excessive organic constituents in the solution. Thereafter, the solution is dispersed in a dispersion solvent, for example, chloroform to prepare an InP/ZnS dispersion solvent, that is, a raw material solution.

Next, in a quantum dot dispersed solution preparation step 12, an electron transporting surfactant addition treatment 12a, a vacuum drying treatment 12b, and a ligand replacement treatment 12c are carried out.

Figure 4A:
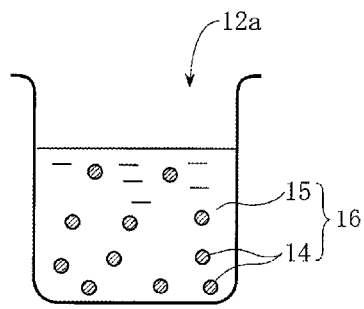
FIGS. 4(a) to 4(c) are diagrams illustrating an example of a method for preparing a quantum dot dispersed solution.
Figure 4B:
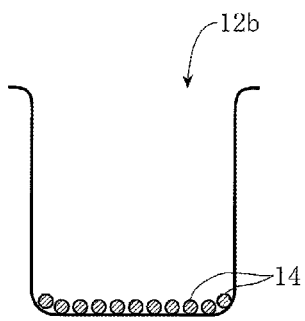
Figure 4C:
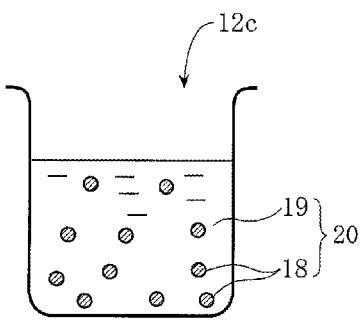

FIGS. 4(a) to 4(c) are diagrams illustrating processes in the quantum dot dispersed solution preparation step 12.

First, in the electron transporting surfactant addition treatment 12a shown in FIG. 4(a), the electron transporting surfactant 9 is added to the InP/ZnS dispersed solution to coat the surfaces of the quantum dots 5 composed of InP/ZnS with the electron transporting surfactant 9. Thus, an electron transport QD dispersed solution 16 (first dispersed solution) is prepared in which quantum dots with an electron transporting surfactant (hereinafter, referred to as "electron transport QD") 14 are dispersed in a dispersion solvent 15.

As the electron transporting surfactant 9, an organic semiconductor material which has an electron transport property (hereinafter, referred to as an "electron transporting material") with a ligand introduced therein is preferably used from the viewpoint of achieving a favorable coordination ability.

In this case, examples of the electron transporting material capable of being used include 2-(4-biphenylyl)-5-(4-t-butylphenyl)-1,3,4-oxaziazole (hereinafter, referred to as "PBD") represented by the chemical formula (1), 2,2',2"-(1,3,5-benzylnitrile)-tris(1-phenyl-1-H-benzoimidazole (hereinafter, referred to as "TPBi") represented by the chemical formula (2), 2,9-dimethyl-4,7-diphenyl-1,10-phenanthroline (hereinafter, referred to as "BCP") represented by the chemical formula (3), 3-(benzothiazole-2-yl)-7-(diethylamino)-2H-1-benzopyran-2-on (hereinafter, referred to as "coumarin 6") represented by the chemical formula (4), bis(2-methyl-8-quinolinolato)-4-(phenylphenolato)aluminum (hereinafter, referred to as "BAlq") represented by the chemical formula (5), 4,4'-bis(9-carbazolyl)-2,2'-dimethylbiphenyl (hereinafter, referred to as "CDBP") represented by the chemical formula (6), and derivatives thereof.

[Chemical Formula 1]

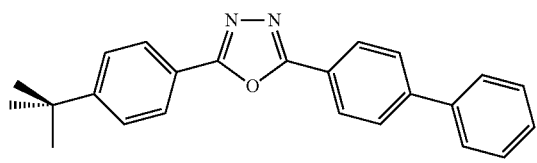

(1)

PBD

[Chemical Formula 2]

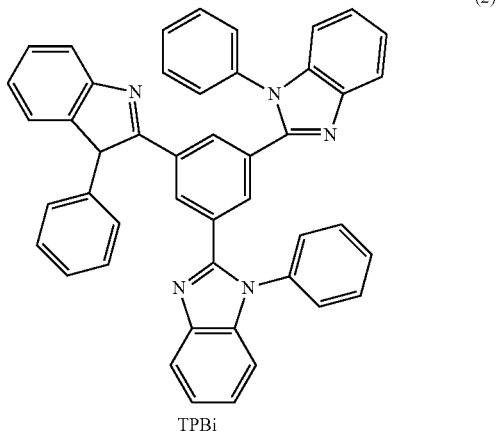

(2)

TPBi

-continued

[Chemical Formula 3]

(3)

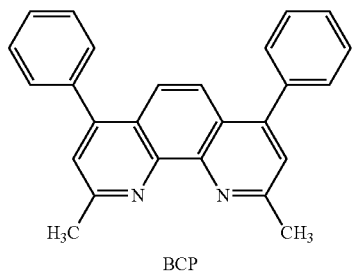

BCP

[Chemical Formula 4]

(4)

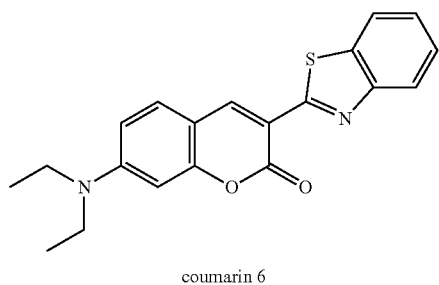

coumarin 6

[Chemical Formula 5]

(5)

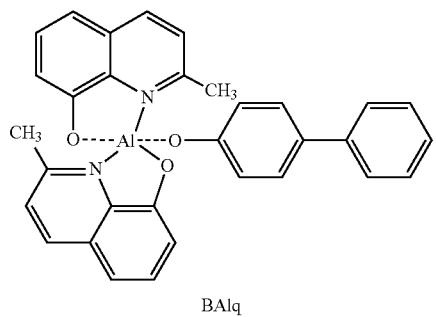

BAlq

[Chemical Formula 6]

(6)

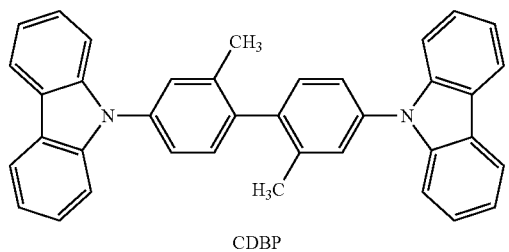

CDBP

It is to be noted that while tris(8-hydroxyquinoline)aluminum (hereinafter, referred to as "Alq3") is preferably used in the case of film formation onto the surface of the quantum dot layer 3 by a dry process such as a vacuum deposition method, the use of Alq3 is not appropriate in the case of film formation by a wet process as in the present embodiment. This is because Alq3 is inferior in solubility, which leads to a decrease in ligand density, and thus hard to use, and moreover, due to the fact that Alq3 is likely to produce luminescence, there is a possibility that Alq3 may be recombined with holes to generate excitons in the surfactant.

In addition, the ligand is not particularly limited, as long as the ligand is a polar group, and for example, a thiol group (—SH), an amino group (—NH$_2$), a carboxyl group (—COOH), a carbonyl group (—CO), a nitro group (—NO$_2$), a phosphino group (—PH$_2$), a phosphoroso group (—PO) and the like can be used. It is to be noted that the case of a single type of ligand allows for dispersion in non-polar solvents, whereas the case of two or more types of ligands also allows for dispersion in polar solvents.

Next, in the vacuum drying treatment 12b shown in FIG. 4(b), the electron transport QD dispersed solution 16 is subjected to vacuum drying to evaporate the dispersion solvent 15, and thereby to obtain the electron transport QD 14.

Then, in the ligand replacement treatment 12c shown in FIG. 4(c), the electron transport QD 14 is immersed in a dispersion solvent 19 (second dispersed solution) containing the hole transporting surfactant 8 in large amounts (for example, 100 times the electron transporting surfactant 9) as compared with the electron transporting surfactant 9, to bring the electron transport QD 14 into contact with the hole transporting surfactant 8. Then, when the resultant is left for a predetermined period of time, a portion of the electron transporting surfactant 9 is replaced with the hole transporting surfactant 8, thereby preparing a hole-electron transport QD dispersed solution 20, that is, a quantum dot dispersed solution in which quantum dots with the hole transporting and electron transporting surfactants (hereinafter, referred to as "hole-electron transport QD") 18 are dispersed in the dispersion solvent 19.

In this case, as the dispersion solvent 19, a non-polar solvent, for example, chloroform can be used which has favorable volatility, and easily allows for separation into the quantum dot layer 3 and the hole transport layer 2.

It is to be noted that as will be described later, the hole-electron transport QD dispersed solution 20 has a large amount of hole transporting surfactant 8, which is not involved in the replacement, suspended in the dispersion solvent 19.

Figure 5A:
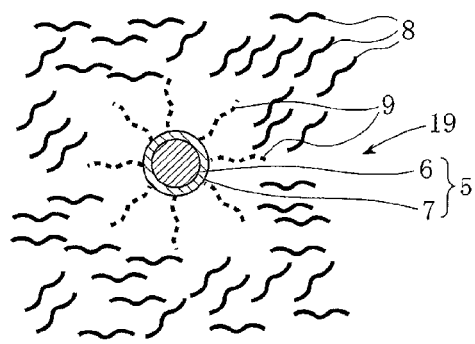
FIGS. 5(a) to 5(c) are schematic diagrams for explaining an electron transporting surfactant replaced with a hole transporting surfactant.
Figure 5B:
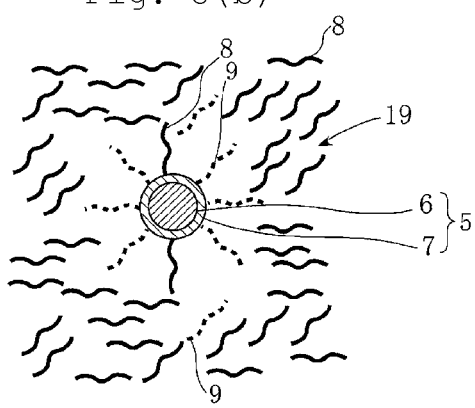
Figure 5C:
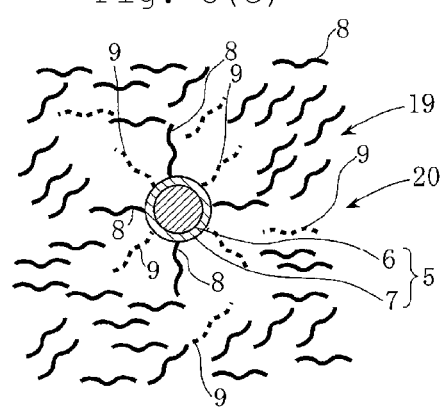

FIGS. 5(a) to 5(c) are diagrams schematically illustrating the ligand replacement treatment 12c described above.

More specifically, as shown in FIG. 5(a), in the electron transport QD 14, the electron transporting surfactant 9 is coordinated on the surface of the quantum dot 5. Then, when the electron transport QD 14 is immersed in the dispersion solvent 19 containing the hole transporting surfactant 8 in large amounts as compared with, for example, 100 times the electron transporting surfactant 9, a large amount of the hole transporting surfactant 8 is suspended around the electron transport QD 14, and the hole transporting surfactant 8 is present at a sufficiently high concentration as compared with the electron transporting surfactant 9 in the dispersion solvent 19.

Then, as shown in FIG. 5(b), due to the difference in concentration between the hole transporting surfactant 8 and the electron transporting surfactant 9, the higher concentration of the hole transporting surfactant 8 starts to replace the lower concentration of the electron transporting surfactant 9. More specifically, the electron transporting surfactant 9 is merely coordinated by slight polarity, rather than being bonded to the surface of the quantum dot 5. Then, the hole transporting surfactant 8 suspended in the dispersion solvent 19 will start to replace the electron transporting surfactant 9, because the concentration of the hole transporting surfactant 8 is sufficiently higher than that of the electron transporting surfactant 9 coordinated on the quantum dot 5.

Then, after a lapse of a predetermined period of time, as shown in FIG. 5(c), the hole transporting surfactant 8 and the electron transporting surfactant 9 are concurrently coordinated on the surface of the quantum dot 5, thereby preparing the hole-electron transport QD dispersed solution 20.

In addition, this hole-electron transport QD dispersed solution 20 has a large amount of hole transporting surfactant 8, which is not involved in the replacement, suspended around the hole-electron transport QD 18.

More specifically, because the hole transporting surfactant 8 is immersed in large amounts in the dispersion solvent 19 as compared with the electron transporting surfactant 9, the concentration of the hole transporting surfactant 8 is sufficiently higher than the concentration of the electron transporting surfactant 9 even after the completion of the ligand replacement treatment 12c, and for this reason, the large amount of the hole transporting surfactant 8 will be suspended in the solution.

It is to be noted that if the predetermined period of time required for the ligand replacement treatment 12c is excessively long, the hole transporting surfactant 8 will excessively replace the electron transporting surfactant 9, thereby resulting in lack of a carrier transporting balance. For this reason, the predetermined period of time is set to a period of time for which the hole transporting surfactant 8 and the electron transporting surfactant 9 are coordinated on the surface of the quantum dot 5 in a balanced manner, for example, 30 minutes.

As the hole transporting surfactant 8, an organic semiconductor material which has a hole transport property (hereinafter, referred to as a "hole transporting material") with a ligand introduced therein is preferably used from the viewpoint of achieving a favorable coordination ability.

In this case, as the hole transporting material, low-molecular materials are preferred, and examples thereof capable of being used include N,N'-diphenyl-N,N'-bis(3-methylphenyl)-1,1'-biphenyl-4,4'-diamine (hereinafter, referred to as "TPD") represented by the chemical formula (7), 4,4'-bis[N-(1-naphthyl)-N-phenyl-amino]biphenyl (hereinafter, referred to as "α-NPD") represented by the chemical formula (8), 4,4',4"-tris(2-naphthylphenylamino)triphenylamine (hereinafter, referred to as "2-TNATA") represented by the chemical formula (9), N,N'-7-di(1-naphthyl)-N,N'-diphenyl-4,4'-diaminobiphenyl (hereinafter, referred to as "Spiro-NPB") represented by the chemical formula (10), 4,4',4"-tris(3-methylphenylphenylamino)triphenylamine (hereinafter, referred to as "m-MTDATA") represented by the chemical formula (11), and derivatives thereof.

[Chemical Formula 7]

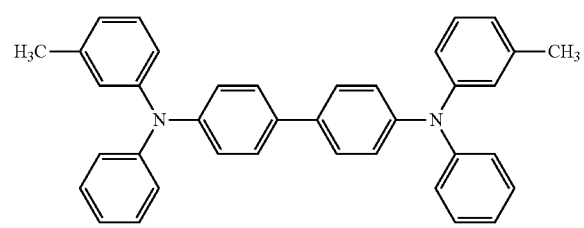

(7)

TPD

[Chemical Formula 8]

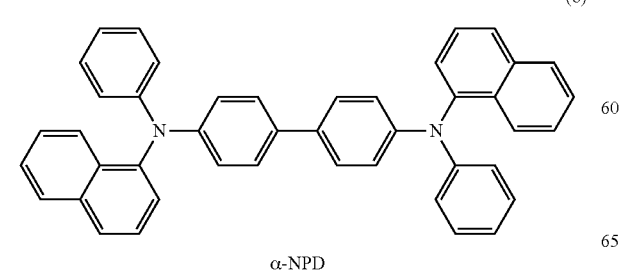

(8)

α-NPD

[Chemical Formula 9]

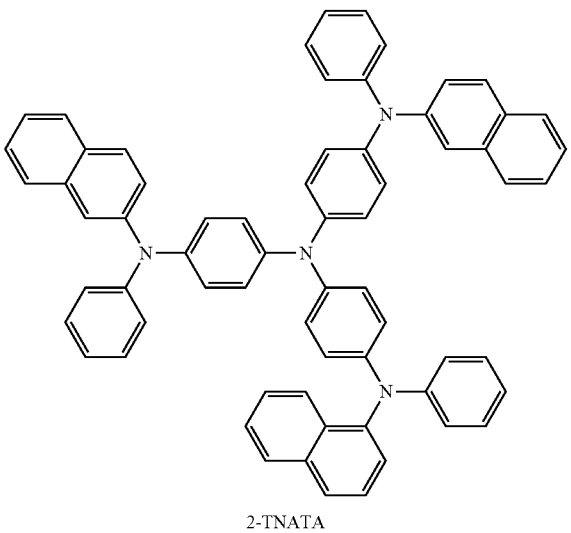

(9)

2-TNATA

[Chemical Formula 10]

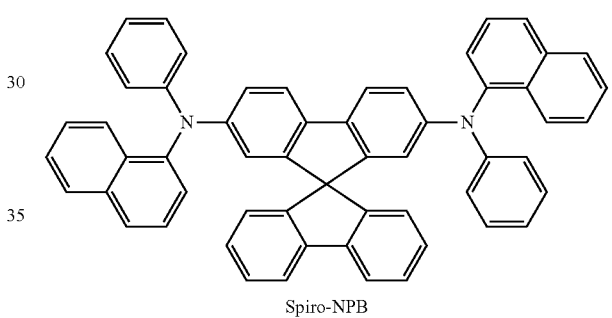

(10)

Spiro-NPB

[Chemical Formula 11]

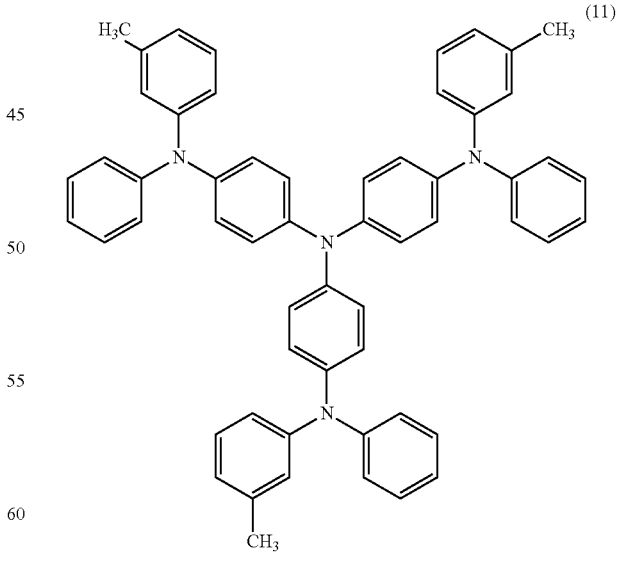

(11)

m-MTDATA

In addition, as in the case of the electron transporting surfactant 9, the ligand is not limited particularly as long as the ligand is a polar group, and for example, one or two or more of a thiol group (—SH), an amino group (—NH$_2$), a carboxyl group (—COOH), a carbonyl group (—CO), a nitro group (—NO$_2$), a phosphino group (—PH$_2$), a phosphoroso group (—PO) and the like can be used.

Therefore, for example, a TPD-thiol ligand with a thiol group introduced into TPD, an α-NPD-amino ligand with an amino group introduced into α-NPD, and the like can be used as the hole transporting surfactant 8.

It is to be noted that it is not preferable to use a polymer material such as poly(3,4-ethylenedioxythiophene):poly(styrenesulfonate) (PEDOT:PSS) in the material for the hole transporting surfactant. This is because the polymer material is large in molecular size, which offers steric hindrance, thus failing to shorten the distance between neighboring molecules, and as a result, the surface coverage of the quantum dot 5 will be decreased to cause a decrease in quantum yield, or fail to increase the density of the quantum dot layer 3.

Subsequently, in an application step 13 (FIG. 3), the hole-electron transport QD dispersed solution 20 prepared in the quantum dot dispersed solution preparation step 12 is used to form a thin film which has a two-layer structure.

More specifically, when a spin coating or the like is used to apply the hole-electron transport QD dispersed solution 20 onto the substrate 4, the hole-electron transport QD dispersed solution 20 is separated into a two-layer structure composed of the hole transport layer 2 containing the suspended hole transporting surfactant 8 as its main constituent and the quantum dot layer 3, and as shown in FIG. 1, the hole transport layer 2 is formed on the substrate 4, and the quantum dot layer 3 is formed on the hole transport layer 2.

It is presumed that it is for the following reason that the separation into the two-layer structure can be achieved as described above.

More specifically, when the hole-electron transport QD dispersed solution 20 is applied uniformly onto the substrate 4, and dried, it is considered that the dispersion solvent 19 in the hole-electron transport QD dispersed solution 20 is evaporated, while the quantum dots 5 moves to the upper layer side in a form along with the dispersion solvent 19 because the quantum dots 5 is compatible and comfortable with the dispersion solvent 19, and as a result, the separation into the hole transport layer 2 and the quantum dot layer 3 forms the thin film which has the two-layer structure.

It is to be noted that while the electron transporting surfactant 9 replaced with the hole transporting surfactant 8 is suspended in the dispersion solvent 19, the slight amount of suspended electron transporting surfactant 9 as compared with the hole transporting surfactant 8 will thus not affect the film function.

As described above, in the first embodiment, the electron transport QD dispersed solution 16 is prepared in which the electron transporting surfactant 9 is coordinated on the surfaces of the quantum dots 5, and subjected to vacuum drying, and then, the hole transporting surfactant 8 prepared in large amounts as compared with the electron transporting surfactant 9 is brought into contact with the electron transport QD 14 in the solution to prepare the hole-electron transport QD dispersed solution 20 with a portion of the electron transporting surfactant 9 replaced with the hole transporting surfactant 8. Thus, the need for a series of complicated step for removing suspended ligands is eliminated to make it possible to easily carry out the ligand replacement treatment 12c without peeling of the carrier transporting surfactants 8, 9 from the surface of the quantum dots 3. More specifically, the desired ligand replacement operation can be carried out without providing a series of complicated step for removing suspended ligands, which can suppress the decrease in surface coverage, thus allowing the decrease in quantum yield to be suppressed as much as possible.

Moreover, the hole-electron transport QD dispersed solution 20 is applied onto the substrate 4 to prepare, at the same time, the hole transport layer 2 and the quantum dot layer 3 which has a surface with the hole and electron transporting surfactants coordinated thereon, and thereby to form a thin film which has the two-layer structure. Thus, the hole transport layer 2 and the quantum dot layer 3 can be prepared by one film-forming process, and the production step can be also simplified.

In addition, in the first embodiment, because the thin film which has the two-layer structure is formed by one film-forming process as described above, there is no need to adjust the dispersion solvents as in the case of preparing the hole transport layer 2 and the quantum dot layer 3 by separate steps, and a contribution can be also made to an improvement in productivity. In other words, in the case of preparing the hole transport layer 2 and the quantum dot layer 3 by separate steps, there is a need to select a dispersion solvent which is not dissolved in the hole transport layer 2 as an underlying layer, for the preparation of the quantum dot layer 3. For example, when water as a polar solvent is used in the dispersion solvent for the hole transporting material, a non-polar solvent such as chloroform has to be selected as the dispersion solvent for the preparation of the quantum dot layer, and there is thus a significant limit to the selection of the dispersion solvent.

In contrast, in the first embodiment, it is only necessary to select one type of dispersion solvent which is suitable for the materials used, because the hole transport layer 2 and the quantum dot layer 3 are prepared at the same time.

Figure 6:
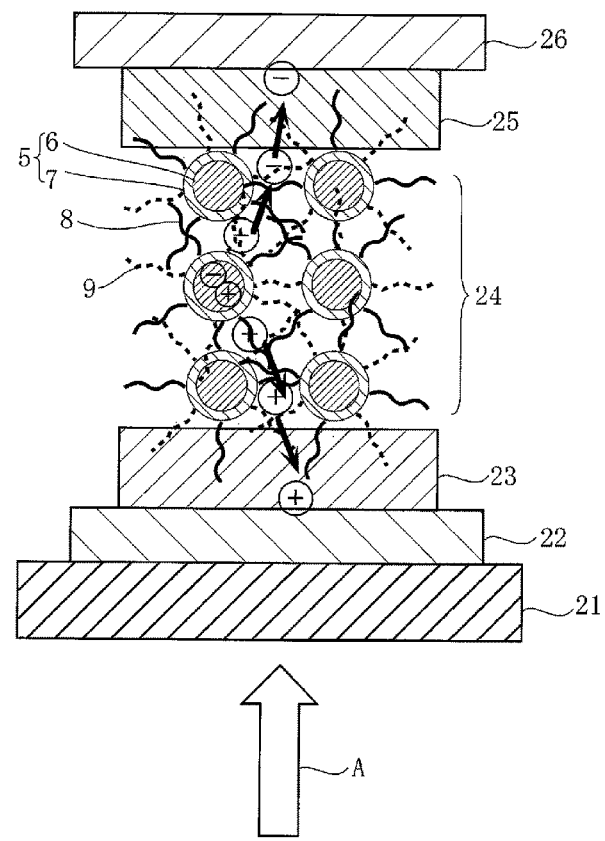
FIG. 6 is a cross-sectional view schematically illustrating a solar cell as a photoelectric conversion device, produced by the use of the thin film forming method according to the first embodiment.

FIG. 6 is a cross-sectional view schematically illustrating an embodiment of a solar cell as a photoelectric conversion device (quantum dot device).

This solar cell has a positive electrode 22 formed on a glass substrate 21, a hole transport layer 23 composed of a hole transporting surfactant, which is formed on the surface of the positive electrode 22, and further a quantum dot layer 24 of stacked structure, which is formed on the surface of the hole transport layer 23. In addition, an electron transport layer 25 composed of an electron transporting material is formed on the surface of the quantum dot layer 24, and a negative electrode 26 is formed on the surface of the electron transport layer 25.

In this solar cell, on light irradiation from a direction indicated by an arrow A, carriers are generated in the core sections 6 of the quantum dots 5, and extracted to the outside of the core sections 6 by absorption of excitons. Then, among the extracted carriers, holes are transported through the hole transporting surfactant 8 to the positive electrode side, and electrons are transported through the electron transporting surfactant 9 to the negative electrode side. The holes are transported to the hole transport layer 23 through the hole transporting surfactant 8 forming a bulkhetero-like network, and further transported to the positive electrode 22. On the other hand, the electrons are transported to the electron transport layer 25 through the electron transporting surfactant 9 forming a bulkhetero-like network, and further transported from the electron transport layer 25 to the negative electrode 26, thereby generating a photoelectromotive force.

FIGS. 7(a) to 7(d) are production step diagrams illustrating a method for producing the solar cell.

Figure 7A:
FIGS. 7(a) to 7(d) are production step diagrams illustrating a method for producing the solar cell.

First, as shown in FIG. 7(a), an ITO film is deposited on the glass substrate 21 by a sputtering method, and subjected to a UV ozone treatment to form the positive electrode 22 of 100 nm to 150 nm in film thickness.

Next, the above-described hole-electron transport QD dispersed solution 20 is prepared.

It is to be noted that various materials can be used as the hole transporting surfactant 8 and the electron transporting surfactant 9 as described above.

However, in order to transport the carriers rapidly with high efficiency so as to prevent phonon bottleneck from being caused, the carriers are desirably transported to the quantum dots 5 through the use of tunneling resonance.

Thus, from this point of view, it is preferable to use, as the hole transporting surfactant 8, a TPD-thiol ligand (HOMO level: approximately 5.6 eV) which easily produces tunneling resonance with valence band level (approximately 5.7 eV) of the InP as the core sections 6, and to use, as the electron transporting surfactant 9, a BCP-amino ligand (LUMO level: approximately 3.2 eV) which easily produces tunneling resonance with conduction band level (approximately 3 eV) of the InP.

Figure 7B:
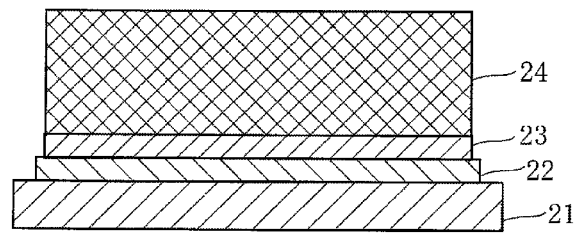

Then, a spin coating method or the like is used for application onto the positive electrode 22, and drying is carried out. Then, as shown in FIG. 7(b), the hole transport layer 23 and the hole-electron transport QD layer 24 are prepared at the same time in the form of separation into two layers. In this case, the hole transport layer 23 is formed, for example, to have a film thickness of 20 nm to 30 nm, whereas the hole-electron transport QD layer 24 is formed into a stacked structure to have a film thickness of 300 nm to 1000 nm.

Figure 7C:
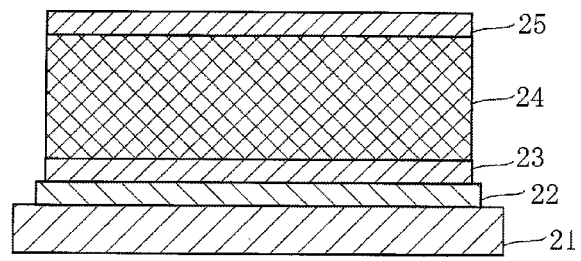

Next, an electron transporting material such as Alq3 is used to form the electron transport layer 25 of 50 nm to 70 nm in film thickness on the surface of the quantum dot layer 24 by a vacuum deposition method, as shown in FIG. 7(c).

Figure 7D:
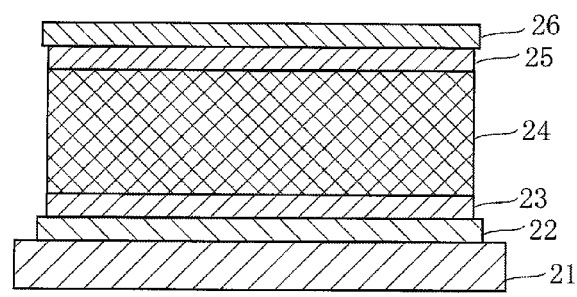

Then, as shown in FIG. 7(d), Ca, Al, or the like is used to form the negative electrode 26 of 100 nm to 300 nm in film thickness by a vacuum deposition method, thereby preparing a solar cell.

As described above, the solar cell is produced by the use of the thin film forming method according to the present invention. Thus, the decrease in surface coverage can be suppressed, and the inactivation of surface defects can be maintained adequately. Therefore, at the time of the injection of carriers into the quantum dots 5, useless carrier deactivation can be also avoided as much as possible, thereby improving the quantum yield in the transition process.

In addition, because the quantum dot layer 24 with the concurrently coordinated surfactants for transporting only electrons or only holes is formed on the hole transport layer 23, the carrier recombination in the surfactants 8, 9 can be prevented more effectively, thereby allowing the carrier transport efficiency to be improved dramatically.

As described above, according to the first embodiment, without recombination of holes and electrons near the surfaces of quantum dots as ultrafine particles or in the surfactants, holes and electrons are transported in separate pathways respectively through the hole transporting surfactant 8 and the electron transporting surfactant 9, and can be efficiently transported to the positive electrode 22 or the negative electrode 26. Thus, the transport efficiency (extraction efficiency) of carriers from the quantum dots 5 can be improved, and the photoelectric conversion from optical signals to electrical signals can be achieved with high efficiency.

Figure 8:
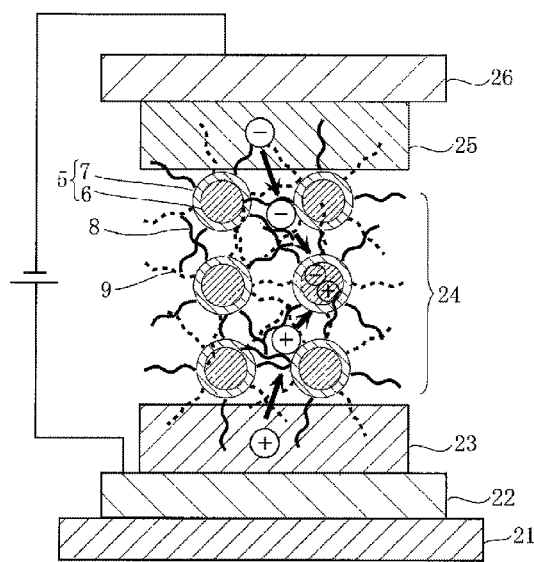
FIG. 8 is a cross-sectional view schematically illustrating a light emitting diode as a photoelectric conversion device, produced by the use of the thin film forming method according to the first embodiment.

FIG. 8 is a cross-sectional view schematically illustrating an embodiment of a light emitting diode as a photoelectric conversion device.

This light emitting diode has the same structure as the solar cell described above, and a quantum dot layer 24 of stacked structure is interposed between a hole transport layer 23 and an electron transport layer 25.

Further, also in the present embodiment, the hole transport layer 23 and the quantum dot layer 24 can be prepared at the same time in the same manner as in the case of FIGS. 7(a) to 7(d).

In this light emitting diode, when a voltage is applied, carriers are injected into a positive electrode 22 and a negative electrode 26. Then, among the injected carriers, the holes are injected into quantum dots 5 through a hole transporting surfactant 8 forming a bulkhetero-like network. On the other hand, the electrons are likewise injected into the quantum dots 5 through an electron transporting surfactant 9 forming a bulkhetero-like network, and the holes and the electrons are recombined in the quantum dots 5 to produce luminescence.

As described above, in the light emitting diode, holes and electrons are transported from the quantum dots 5 to the hole transport layer 23 or the electron transport layer 25 in separate pathways respectively through the hole transporting surfactant 8 and the electron transporting surfactant 9. Thus, as in the case of the solar cell in FIG. 6, without recombination of holes and electrons brought closer to each other during the transport, the carrier transport can be achieved efficiently, and the transport efficiency (injection efficiency) of carriers can be improved.

Figure 9:
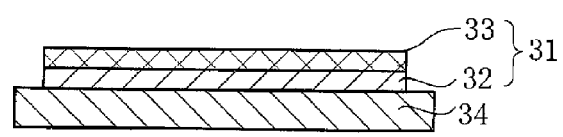
FIG. 9 is a cross-sectional view schematically illustrating a thin film prepared by the use of a thin film forming method according to a second embodiment.

FIG. 9 is a cross-sectional view schematically illustrating a thin film prepared by the use of a thin film forming method according to a second embodiment of the present invention.

This thin film 31 has a two-layer structure of an electron transport layer 32 containing an electron transporting surfactant (second surfactant) as its main constituent and a quantum dot layer 33, and is formed on a substrate 34.

Figure 10:
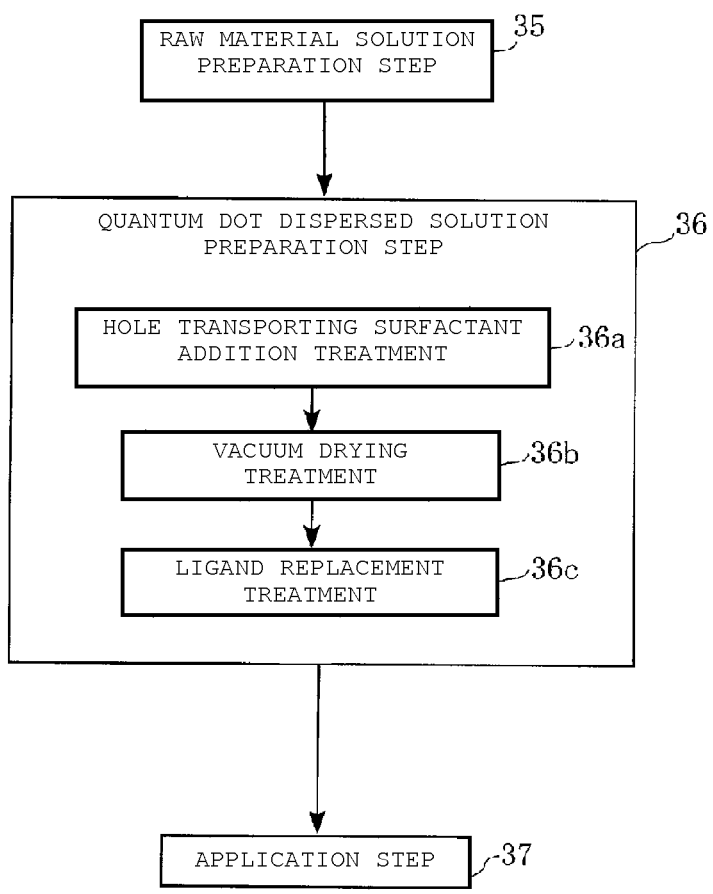
FIG. 10 is a production step diagram showing a second embodiment of a thin film forming method.

FIG. 10 is a production step diagram showing an preparation method of the thin film 31.

More specifically, in a raw material solution preparation step 35, a raw material solution such as an InP/ZnS dispersed solution is prepared in the same manner and procedure as in the first embodiment.

Then, in a quantum dot dispersed solution preparation step 36, a hole transporting surfactant addition treatment 36a is carried out. More specifically, a hole transporting surfactant 8 is added to the raw material solution to coat the surfaces of quantum dots 5 with the hole transporting surfactant 8, thereby preparing a hole transport QD dispersed solution in which the quantum dots with the hole transporting surfactant (hereinafter, referred to as "hole transport QD") are dispersed in a dispersion solvent.

Then, vacuum drying is carried out to evaporate the dispersion solvent in a vacuum drying treatment 36b, and a ligand replacement treatment 36c is then carried out.

More specifically, an electron transporting surfactant 9 prepared in large amounts as compared with the hole transporting surfactant 8 is used to immerse the hole transport QD in a dispersion solvent containing the electron transporting surfactant 9, and the solution is left for a predetermined period of time. Then, on the same principle as described in detail with reference to FIGS. 5(a) to 5(c), a portion of the hole transporting surfactant 8 is replaced with the electron transporting surfactant 9, thereby preparing an electron-hole transport QD dispersed solution in which electron-hole transport QD is dispersed in the dispersion solvent.

Subsequently, in an application step 37, the electron-hole transport QD dispersed solution prepared in the quantum dot dispersed solution preparation step 36 is used to form a thin film which has a two-layer structure.

More specifically, when a spin coating or the like is used to apply the electron-hole transport QD dispersed solution onto the substrate 34, the solution is separated into a two-layer structure composed of the electron transporting layer 32 containing, as its main constituent, the electron transporting surfactant 9 suspended in the dispersion solvent, and of the quantum dot layer 33, and as shown in FIG. 9, the electron transport layer 32 is formed on the substrate 34, and the quantum dot layer 33 is formed on the electron transport layer 32.

Figure 11:
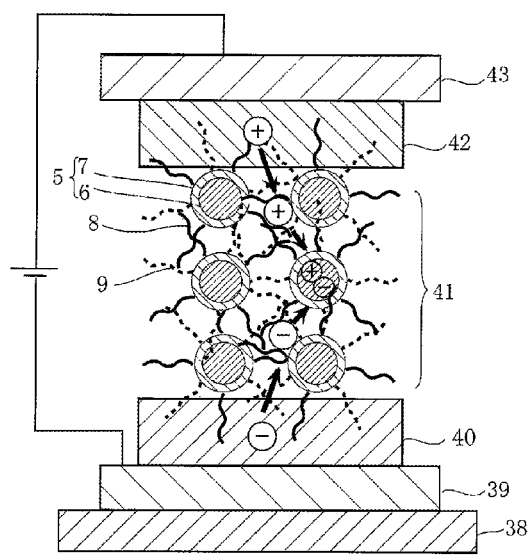
FIG. 11 is a cross-sectional view schematically illustrating a light emitting diode as a photoelectric conversion device, produced by the use of the thin film forming method according to the second embodiment.

FIG. 11 is a cross-sectional view schematically illustrating an embodiment of a light emitting diode produced by the use of the thin film forming method according to the second embodiment.

This light emitting diode has a negative electrode 39 formed on a glass substrate 38, an electron transport layer 40 formed on the surface of the negative electrode 39, which is composed of an electron transporting surfactant, a quantum dot layer 41 of stacked structure formed on the surface of the electron transport layer 40, further a hole transport layer 42 formed on the surface of the quantum dot layer 41, which is composed of a hole transporting material, and a positive electrode 43 formed on the surface of the hole transport layer 42.

Further, in the second embodiment, the negative electrode 39 is supposed to be formed on the substrate 38 due to the electron transport layer 40 provided on the substrate 38 side, thereby allowing device sealing to be simplified in addition to the first embodiment.

More specifically, it is often the case where the negative electrode 39 is chemically active due to the use of a material which has a low work function for the negative electrode 39, and the negative electrode 39 is thus preferably prevented as much as possible from being brought into contact with the atmosphere.

Further, when the electron transport layer 40 is provided on the substrate 38 side as in FIG. 11, the negative electrode 39 is sandwiched by the substrate 38 and the electron transport layer 40, thereby allowing the negative electrode 39 to be confined in the device. Therefore, the negative electrode is less likely to be brought into contact with the atmosphere as compared with the case of the positive electrode provided on the substrate side (see FIG. 6 or 8), thereby making it possible to simplify the device sealing, and allowing for further reduction in cost.

Figure 12:
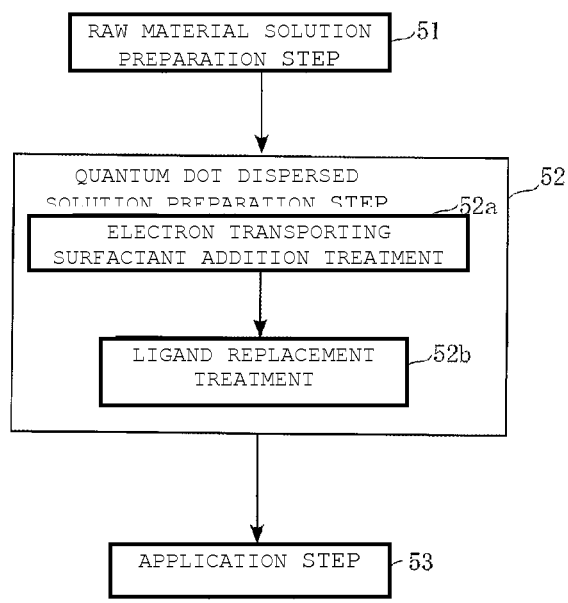
FIG. 12 is a cross-sectional view schematically illustrating a third embodiment of a thin film forming method according to the present invention.
Figure 13:
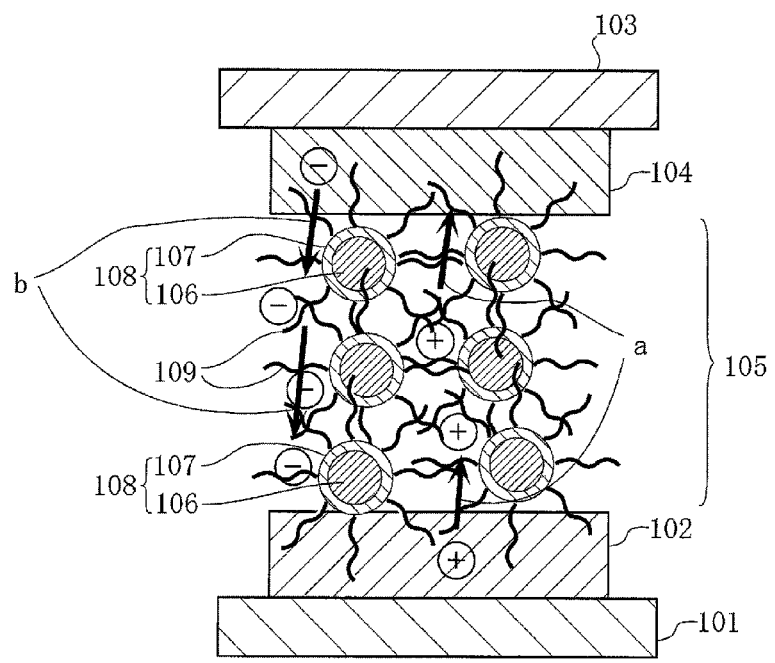
FIG. 13 is a cross-sectional view schematically illustrating carrier transport in the case of using a conductive surfactant.
Figure 14:
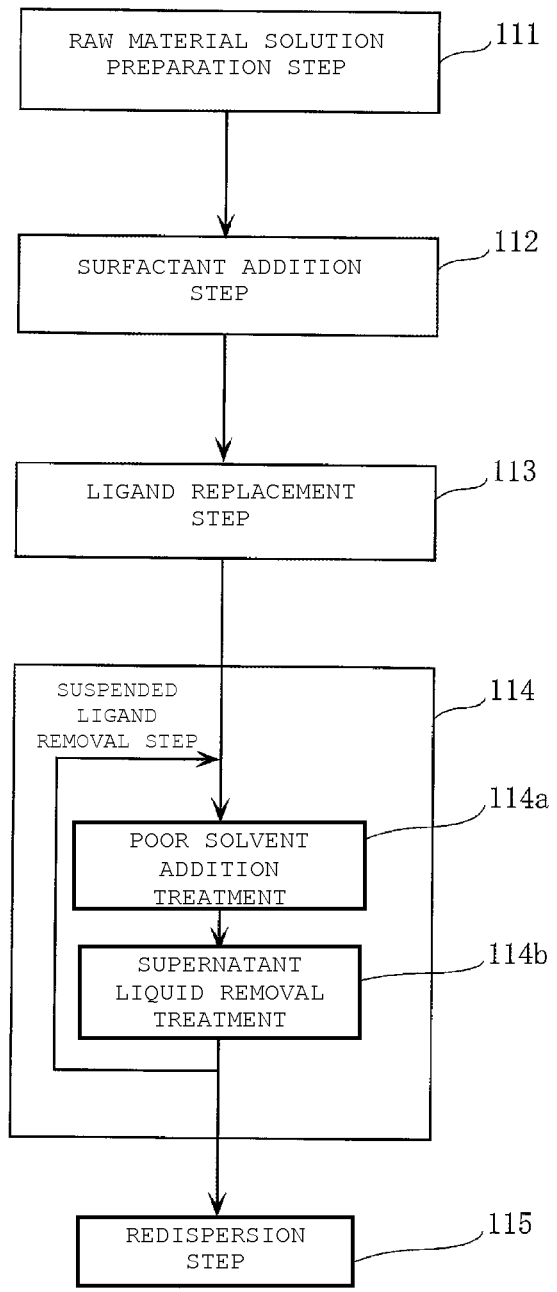
FIG. 14 is a production step diagram showing a method for producing a nanoparticle material described in Patent Document 1.

FIG. 12 is a production step diagram showing a third embodiment of a thin film forming method according to the present invention, and in the third embodiment, a hole transporting surfactant prepared in large amounts is immersed directly in an electron transport QD dispersed solution, instead of the vacuum drying treatments 12b, 36b in the first and second embodiments (see FIGS. 3 and 10).

In this third embodiment, a raw material solution is also prepared in a raw material solution preparation step 51 in the same manner and procedure as in the first and second embodiments. Then, in a quantum dot dispersed solution preparation step 52, an electron transporting surfactant addition treatment 52a is carried out to prepare an electron transport QD dispersed solution, and in a subsequent ligand replacement treatment 52b, a large amount of hole transporting surfactant 8 is immersed in the electron transport QD dispersed solution, thereby replacing a portion of an electron transporting surfactant 9 with the hole transporting surfactant 8.

As described above, in the third embodiment, the hole transporting surfactant 8 prepared in large amounts as compared with the electron transporting surfactant 9 is brought into contact with the electron transport QD in the solution, also thereby making it possible to easily prepare the same hole-electron transport QD dispersed solution as in the first embodiment.

It is to be noted that the present invention is not limited to the embodiments described above. While the large amount of the hole transporting surfactant 8 is put and thereby immersed in the electron transport QD dispersed solution in the third embodiment, it goes without saying that the same shall apply to the case where a large amount of the electron transporting surfactant 9 is put and thereby immersed in a hole transport QD dispersed solution.

In addition, while the quantum dots 5 have the core-shell structure composed of the core section 6 and the one-layer shell section 7 in the respective embodiments, the present invention can be also applied likewise to a core-shell-shell structure with the shell section 7 composed of a two-layer structure, and a quantum dot without any shell section.

In addition, as for photoelectric conversion devices for achieving the conversion from electrical signals to optical signals, the present invention can be also applied likewise to semiconductor lasers and various types of display devices in addition to light emitting diodes. Furthermore, as for photoelectric conversion devices for achieving the conversion from optical signals to electrical signals, the present invention can be also applied likewise to image sensing elements such as light sensors and CCDs in addition to solar cells.

In addition, while a compound semiconductor composed of InP/ZnS is used as an ultrafine particle film in the embodiments described above, it goes without saying that oxides and single semiconductors can be also applied likewise.

Quantum dots with a hole transporting surfactant and an electron transporting surfactant coordinated on the surfaces thereof can be achieved with high efficiency, and a hole transport layer or an electron transport layer and a quantum dot layer including the quantum dots can be prepared at the same time. Thus, quantum dot devices which are excellent in carrier transport property can be produced without recombination or useless deactivation of holes and electrons in the surfactants or on the surfaces of the quantum dots.

DESCRIPTION OF REFERENCE SYMBOLS

1 Thin film
2 Hole transport layer
3 Quantum dot layer
4 Substrate
5 Quantum dot
8 Hole transporting surfactant
9 Electron transporting surfactant
16 Electron transport QD dispersed solution (first dispersed solution)
19 Dispersion solvent (second dispersed solution)
20 Hole-electron transport QD dispersed solution (quantum dot dispersed solution)
23 Hole transport layer
24 Quantum dot layer
31 Thin film
32 Electron transport layer
33 Quantum dot layer
34 Substrate
40 Electron transport layer
41 Quantum dot layer

The invention claimed is:

1. A thin film forming method, the method comprising:
preparing a quantum dot with a first surfactant coordinated on a surface thereof;
preparing a quantum dot dispersed solution by bringing a second surfactant into contact with the quantum dot in a solution such that a portion of the first surfactant is replaced with the second surfactant; and forming a two-layer film by applying the quantum dot dispersed solution onto a substrate to prepare a surfactant layer containing the second surfactant as its main constituent and a quantum dot layer with the first and second surfactants coordinated on a surface thereof.

2. The thin film forming method according to claim 1, wherein the surfactant layer and the quantum dot layer are applied at the same time on the substrate.

3. The thin film forming method according to claim 1, wherein an amount of the second surfactant in the solution is larger than an amount of the first surfactant.

4. The thin film forming method according to claim 1, wherein, after drying a first dispersed solution in which the quantum dot with the first surfactant is dispersed, the quantum dot with the first surfactant is immersed in a second dispersed solution containing the second surfactant to prepare the quantum dot dispersed solution.

5. The thin film forming method according to claim 1, wherein the second surfactant is immersed in a first dispersed solution in which the quantum dot with the first surfactant is dispersed so as to prepare the quantum dot dispersed solution.

6. The thin film forming method according to claim 1, wherein the quantum dot layer is formed on a surface of the surfactant layer.

7. The thin film forming method according to claim 1, wherein the first surfactant is an electron transporting surfactant, and the second surfactant is a hole transporting surfactant.

8. The thin film forming method according to claim 1, wherein the first surfactant is a hole transporting surfactant, and the second surfactant is an electron transporting surfactant.

9. The thin film forming method according to claim 1, wherein a dispersion solvent of the quantum dot dispersed solution is chloroform.

10. The thin film forming method according to claim 1, wherein the quantum dot has a core-shell structure.

11. The thin film forming method according to claim 10, wherein the quantum dot has a core and a single shell layer.

12. The thin film forming method according to claim 10, wherein the core of the core-shell structure is a semiconductor material which has a photoelectric conversion effect.

* * * * *

UNITED STATES PATENT AND TRADEMARK OFFICE
CERTIFICATE OF CORRECTION

| | | |
|---|---|---|
| PATENT NO. | : 8,679,880 B2 | Page 1 of 1 |
| APPLICATION NO. | : 13/524283 | |
| DATED | : March 25, 2014 | |
| INVENTOR(S) | : Koji Murayama | |

It is certified that error appears in the above-identified patent and that said Letters Patent is hereby corrected as shown below:

On the Title page of the Letters Patent, Assignee item (73) should read:

--  Murata Manufacturing Co., Ltd.,  --.

Signed and Sealed this
Twenty-third Day of December, 2014

Michelle K. Lee
*Deputy Director of the United States Patent and Trademark Office*